(12) United States Patent
Padullaparthi

(10) Patent No.: US 9,484,711 B2
(45) Date of Patent: Nov. 1, 2016

(54) SEMICONDUCTOR LASER APPARATUS AND MANUFACTURING METHOD THEREOF

(71) Applicant: SAE Magnetics (H.K.) Ltd., Hong Kong (CN)

(72) Inventor: Babu Dayal Padullaparthi, Hong Kong (CN)

(73) Assignee: SAE MAGNETICS (H.K.) LTD., Hong Kong (CN)

( * ) Notice: Subject to any disclaimer, the term of this patent is extended or adjusted under 35 U.S.C. 154(b) by 43 days.

(21) Appl. No.: 14/600,443

(22) Filed: Jan. 20, 2015

(65) Prior Publication Data

US 2016/0211645 A1     Jul. 21, 2016

(51) Int. Cl.
| | |
|---|---|
| G02B 6/42 | (2006.01) |
| H01S 5/12 | (2006.01) |
| H01S 5/02 | (2006.01) |
| H01S 5/022 | (2006.01) |
| H01S 5/125 | (2006.01) |

(52) U.S. Cl.
CPC ........... *H01S 5/1228* (2013.01); *G02B 6/4206* (2013.01); *H01S 5/021* (2013.01); *H01S 5/02284* (2013.01); *H01S 5/1203* (2013.01); *H01S 5/02256* (2013.01); *H01S 5/125* (2013.01)

(58) Field of Classification Search
None
See application file for complete search history.

(56) References Cited

U.S. PATENT DOCUMENTS

| 7,016,587 B2 | 3/2006 | Kubby et al. |
| 8,767,792 B2 | 7/2014 | Bowers et al. |
| 2008/0198888 A1 | 8/2008 | Arimoto |

OTHER PUBLICATIONS

Fang et al., "Electrically Pumped Hybrid AlGaInAs-silicon Evanescent Laser", Oct. 2, 2006 Optical Society of America, vol. 14, No. 20, 8 pages.
Bakir et al, "Electrically Driven Hybrid Si/III-V Fabry-Pérot Lasers Based on Adiabatic Mode Transformers" May 23, 2011, vol. 19, No. 11, 9 pages.
Stanković, "Hybrid III-V/Si DFB Lasers Based on Polymer Bonding", StankovićPh. D. Thesis at Gent University, 2013, 259 pages.

*Primary Examiner* — Jerry Rahll
(74) *Attorney, Agent, or Firm* — Nixon & Vanderhye PC

(57) ABSTRACT

A semiconductor laser apparatus includes a silicon-on-insulator assembly and an edge-emitting semiconductor laser assembly integrated on the silicon-on-insulator assembly. The silicon-on-insulator assembly includes an optical waveguide at the top which is bonded to the edge-emitting semiconductor laser assembly and configured to couple a laser light emitted from the edge-emitting semiconductor laser assembly, and the optical waveguide includes a core portion located in the middle of the optical waveguide; and at least one vertical rib configured on two sides of the core portion respectively, with a width narrower than that of the core portion. The apparatus obtains a single mode laser operation and has low propagation loss and high mechanical bond strength.

22 Claims, 19 Drawing Sheets

SEMICONDUCTOR LASER APPARATUS AND MANUFACTURING METHOD THEREOF

FIELD OF THE INVENTION

The present invention is related to a semiconductor laser apparatus, and more particularly to a semiconductor laser apparatus with an improved optical waveguide for evanescent coupling of light to form a single mode laser operation for high speed optical communication, and a manufacturing method thereof.

BACKGROUND OF THE INVENTION

In recent years, rapid increase of the Internet traffic has pushed the amount of data transmission sharply, and it has been demanded to increase the operation speed, as well as decrease the size and the cost for optical transmission and receiving equipment or optical components. Under the background described above, development has been conducted vigorously for silicon photonics that realize optical components by using silicon materials for making photonic integrated circuits (PIC) through CMOS processes instead of using optical components made on compound semiconductors such as GaAs and InP substrates directly.

For passive optical components such as optical waveguides, wave guiding by the use of the silicon material has already been confirmed. FIG. 1a shows a conventional semiconductor laser apparatus 100 including active gain medium material stack (LD stack) 102 coupled to passive semiconductor material stack, such as for example the silicon layer of a silicon-on-insulator (SOI) stack 103, which is disclosed in a Ph. D. thesis of Stevan Stanković from Ghent University, ISBN 978-90-8578-594-1, NUR 959, Copyright: D/2013/10.500/27. As shown, the semiconductor laser apparatus 100 includes an optical waveguide 104a disposed in the single layer of semiconductor material 104 which is formed on a silicon substrate 106. The optical waveguide 104a includes an optical cavity 111 defined along the optical waveguide 104 between two reflectors (not shown). In Si photonics based optical transmitters, a III-V Laser Diode (LD) stack 102 is hybridly integrated/bonded with a single silicon waveguide core 104a on the SOI substrate 103 to realize single mode (SM) optical confinement using a thin layer of low dielectric constant polymer such as BCB or DVS BCB 108. FIG. 1b shows a perspective view of the single silicon waveguide 104 in FIG. 1a. Specifically, the silicon waveguide 104 includes a single rib 104a acted as a core in the middle portion of the waveguide 104.

U.S. Pat. No. 7,016,587 B2 also discloses such a single silicon waveguide core, as shown in FIG. 1c, the silicon rib waveguide 130 includes a silicon substrate 125, a single crystal silicon layer 126 and an insulator bonding layer 127 therebetween. A silicon rib 134 between two parallel trenches 135, 136 is formed on the single crystal silicon layer 126, by any suitable patterning process. As shown, a silicon nitride layer 138 is deposited on the patterned surface of the single crystal silicon layer 126, including the trenches 135, 136 and silicon rib (or core) 134 therebetween.

However, the waveguide with a single silicon core (or rib) 104 or 130 will generate high light propagation loss, which requires high index difference between the LD stack and the waveguide of the SOI stack. Also, due to lack of high thermal conductivity material just in between the full length of LD stack 102 and the single silicon core 104a or 134, the heat dissipation is inefficient, and the junction temperature (Tj) of the LD stack 102 increases and degrades the life time of device accordingly.

FIG. 1d shows the theoretical observation that indicates the coupling of light into the single silicon waveguide core 104a. By this token, the light transmission loss in the waveguide core 104a is higher, due to some of optical confinement of light is presented in LD stack of single silicon waveguide core 104.

So for high speed, low cost and highly reliable Si-photonic transmitters, it's desirable to provide a lower loss waveguide and a method to make lower loss waveguide that simultaneously offers SM optical confinement and improved heat dissipation from active region that reduces the junction temperature of LD with high mechanical bond strength.

SUMMARY OF THE INVENTION

One objective of the present invention is to provide a semiconductor laser apparatus integrating an edge-emitting semiconductor laser (EEL) assembly with a silicon-on-insulator (SOI) assembly to obtain a single mode laser operation, which has low propagation loss, efficient heat dissipation and high mechanical bond strength.

Another objective of the present invention is to provide a method of manufacturing a semiconductor laser apparatus integrating an edge-emitting semiconductor laser assembly with a silicon-on-insulator assembly to obtain a single mode laser operation, which has low propagation loss, efficient heat dissipation and high mechanical bond strength.

To achieve above objectives, a semiconductor laser apparatus including a silicon-on-insulator assembly and an edge-emitting semiconductor laser assembly integrated on the silicon-on-insulator assembly. The silicon-on-insulator assembly includes an optical waveguide with a thin layer high refractive index semiconductor at the top which is bonded to the edge-emitting semiconductor laser assembly and configured to evanescently couple a laser light emitted from the edge-emitting semiconductor laser (LD) assembly, and the optical waveguide includes a core portion located in the middle of the optical waveguide; and at least one vertical rib configured at two sides of the core portion respectively, with a width narrow than that of the core portion.

Preferably, the silicon-on-insulator assembly comprises a substrate, a buried oxide layer stacked on the substrate, and the optical waveguide stacked on the buried oxide layer.

Preferably, the optical waveguide is made of silicon.

Preferably, the vertical rib is formed by etching the portions at two sides of the core portion.

Preferably, said etching has a depth that reaches to a bottom of the optical waveguide to expose a top surface of a buried oxide layer of the silicon-on-insulator assembly.

Preferably, said etching has a depth that reaches into a buried oxide layer of the silicon-on-insulator assembly.

Preferably, the edge-emitting semiconductor laser assembly comprises a simple Fabry-Perot (FP) Broad Area (BA) laser, a Distributed Bragg Reflector (DBR) laser, a Distributed Feedback (DFB) laser, or a Quantum cascade laser (QCL).

Preferably, the edge-emitting semiconductor laser assembly has an injected carrier channeling window made of proton implantation or tunnel junction.

As an embodiment, the edge-emitting semiconductor laser assembly comprises the DFB laser which comprises at least one row of DFB gratings disposed on a top surface of the core portion along the length direction thereof.

Preferably, the DFB gratings are made on a bottom clad semiconductor layer or a top clad semiconductor layer.

As another embodiment, the DFB gratings comprise a phase shifted DFB grating in the middle of the gratings.

Optionally, the DFB gratings comprise a phase shifted DFB grating made on a bottom clad semiconductor layer or a top clad semiconductor layer.

Optionally, the DFB gratings comprise phase shifted DFB gratings which are formed on the core portion and a bottom clad semiconductor layer.

Preferably, the edge-emitting semiconductor laser assembly comprises a lower band gap optically active gain materials which comprises single or multiple quantum wells or quantum dots, sandwiched among multiple layers of high band gap barrier materials, and is made of chemical elements selected from III-V, II-VI and IV groups of periodic table.

Preferably, the width of the core portion is in the range of 600 to 3000 nm, and its height is in the range of 200 to 800 nm.

Preferably, the width of the vertical ribs (Wr) and the pitch between the vertical ribs ($\Lambda$) related by duty cycle (DC) as DC=Wr/$\Lambda$, and the DC is in the range of 5-90%, and the height of the vertical ribs is in the range of 200-800nm same as the height of the core portion.

Accordingly, a method of manufacturing a semiconductor laser apparatus, includes steps of:

providing an edge-emitting semiconductor laser assembly;

providing a silicon-on-insulator assembly having an optical waveguide at the top;

patterning a top surface of optical waveguide to form a core portion located in the middle, and at least one vertical rib configured on two sides of the core portion respectively, with a width narrower than that of the core portion; and bonding the edge-emitting semiconductor laser assembly to a top of the optical waveguide of the silicon-on-insulator assembly.

Preferably, said patterning the top surface of the optical waveguide comprises etching the top surface of the optical waveguide to form the core portion and the vertical ribs in the predetermined size.

Preferably, the width of the core portion is in the range of 600 to 3000 nm, a height of the core portion is in the range of 200 to 800 nm=

Preferably, the width of the vertical ribs (Wr) and the pitch between the vertical ribs ($\Lambda$) related by duty cycle (DC) as DC=Wr/$\Lambda$, and the DC is kept in the range of 5-90%, and the height of the vertical ribs is in the range of 200-800 nm same as the height of the core portion.

Preferably, the method further includes forming multiple photonic crystal cavities on the vertical ribs to adjust the effective index of the optical waveguide.

Preferably, the optical waveguide is made of silicon.

In comparison with the prior art, when the laser light is emitted from the edge-emitting semiconductor laser assembly, the optical waveguide guides the laser light to confine within the core portion with lower transmission loss. Further, the light is confined in single mode due to the significant effective refractive index difference between the LD stack and the SOI stack that includes optical waveguide of silicon. Additionally, the multiple ribs of the waveguide are beneficial to reduce the junction temperature due to its high thermal conductivity, thereby increasing the life time for the optical device, and meanwhile, the corrugation ribs are also beneficial to enhance the mechanical bond strength between the bonding layer and the optical waveguide.

Other aspects, features, and advantages of this invention will become apparent from the following detailed description when taken in conjunction with the accompanying drawings, which are a part of this disclosure and which illustrate, by way of example, principles of this invention.

BRIEF DESCRIPTION OF THE DRAWINGS

The accompanying drawings facilitate an understanding of the various embodiments of this invention. In such drawings.

DETAILED DESCRIPTION OF ILLUSTRATED EMBODIMENTS

Figure 1A:
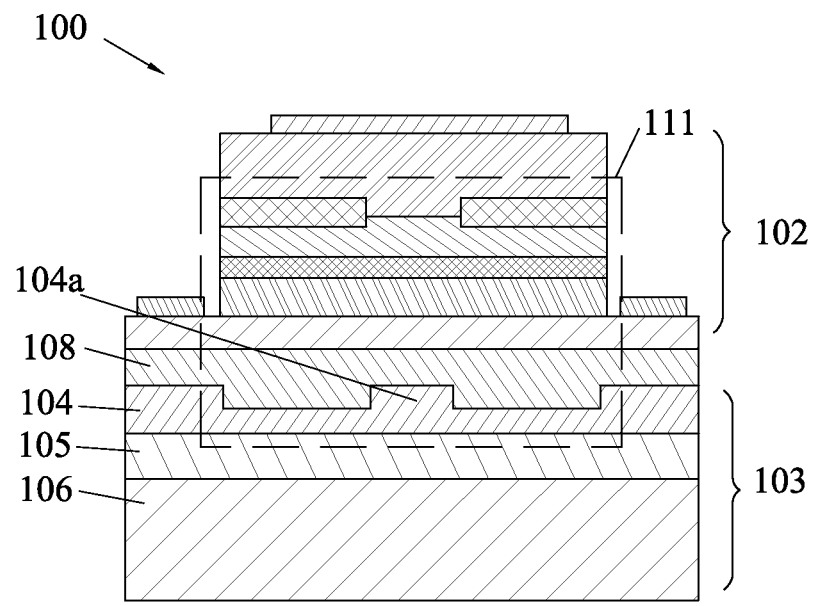
FIG. 1a is a cross section of a conventional semiconductor hybrid laser (LD) stack and SOI stack bonded together with a thin layer of BCB polymer.

Various preferred embodiments of the invention will now be described with reference to the figures, wherein like reference numerals designate similar parts throughout the various views. As indicated above, the invention is directed to a semiconductor laser apparatus integrating an edge-emitting semiconductor laser (EEL) assembly (also called as LD stack, thereinafter) a silicon-on-insulator (SOI) assembly (also called as SOI stack, thereinafter) and a manufacturing method thereof to obtain an optical single mode operation, which has low loss propagation and high mechanical bond strength.

Figure 2A:
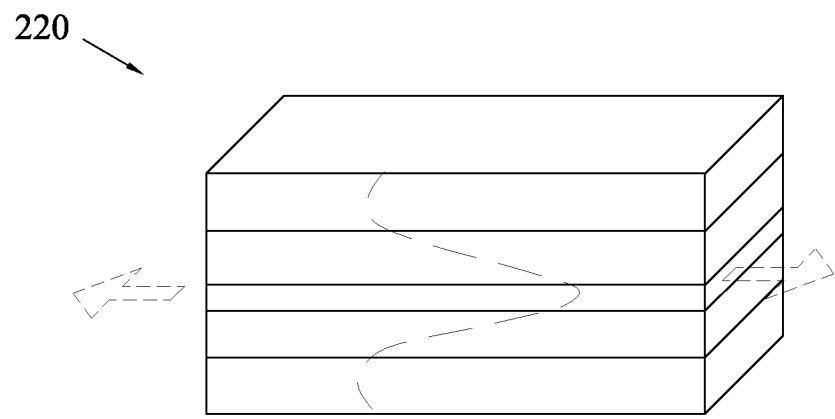
FIG. 2a shows the emission of light from edges or facets of a semiconductor LD stack without bonding to SOI stack.
Figure 2B:
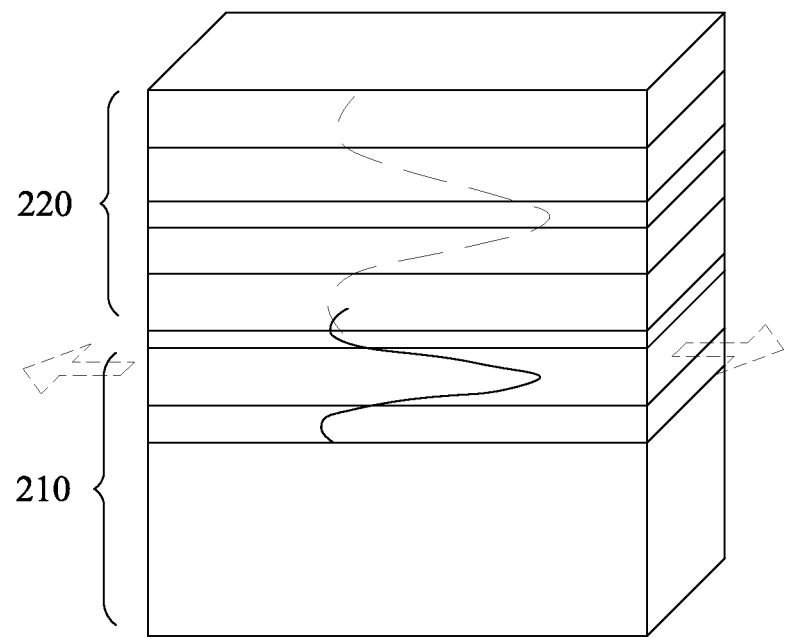
FIG. 2b shows the evanescent coupling of light from light emitting layers of LD stacks to the single silicon optical waveguide in SOI stack; In this case, there will be no light emission from edges of semiconductor laser (LD) stack.
Figure 2C:
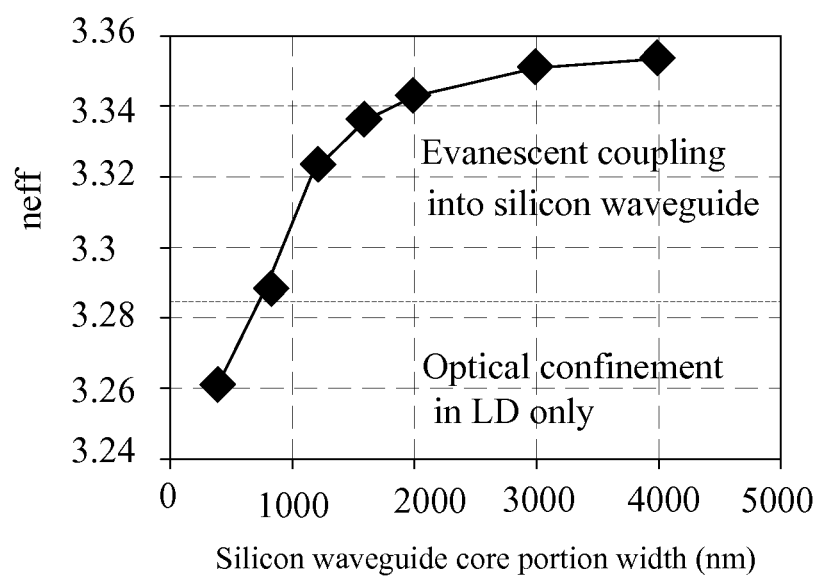
FIG. 2c shows a graph indicating the condition for evanescent coupling of light from the LD stack to the SOI stack.

Referring to FIGS. 2a, 2b, 2c, the concept of evanescent coupling of light between the LD stack and SOI stack will be described generally, which is helpful to understand the present invention. In an EEL assembly (LD stack) 220, the light emits from edges of the laser through its cleaved facets as shown in FIG. 2a. These cleaved facets can also be coated by reflecting mirrors to extract light from one edge completely. When the LD stack 220 is integrated on SOI stack 210, due to the increased effective refractive index value of SOI stack 210 having a silicon waveguide (not shown in the figure), the light from EEL assembly 220 evanescently coupled to the silicon waveguide and light emerges from end facets of the silicon waveguide as shown in FIG. 2b. FIG. 2c shows a simple calculation of LD emitting at 1.31 µm when integrated with a silicon waveguide core having a width of 800 nm, and the light emitted from LD stack 220 is evanescently coupled to the silicon waveguide. In the silicon waveguide core with a width below 800 nm, there is no coupling of light into the silicon waveguide core. Light is evanescently coupled to silicon waveguide core when the silicon waveguide core width is above 800 nm During evanescent coupling the light from the LD stack 220 partially or fully coupled to silicon waveguide core and careful design of the silicon waveguide is needed to fully couple light from LD stack 220 to the silicon waveguide core for achieving low loss transmission of light.

Figure 3A:
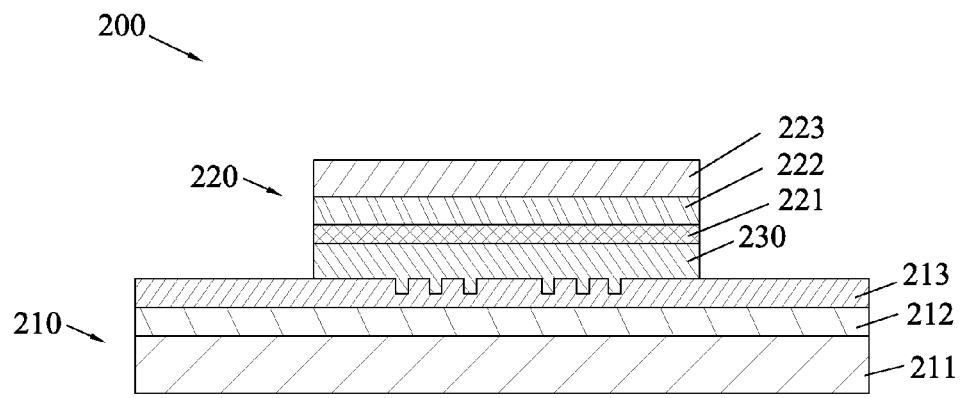
FIG. 3a is a cross section of a semiconductor laser apparatus according to a first embodiment of the present invention, with a LD stack integrated on a SOI stack.

Referring to FIG. 3a, a semiconductor laser apparatus 200 according to one embodiment of the present invention includes a silicon-on-insulator (SOI) assembly (SOI stack) 210 and an edge-emitting semiconductor layer (EEL) assembly (LD stack) 220 integrated on the SOI assembly 210. Specifically, a bonding layer 230 is configured between the SOI assembly 210 and the edge-emitting semiconductor laser assembly 220 to bond them together. Preferably, the bonding layer 230 is made of benzo-cyclo-butene (BCB) or DVS BCB. The laser emitted from the edge-emitting semiconductor laser assembly 220 is to be coupled to the SOI assembly 210 to obtain a confined optical single mode.

Figure 3B:
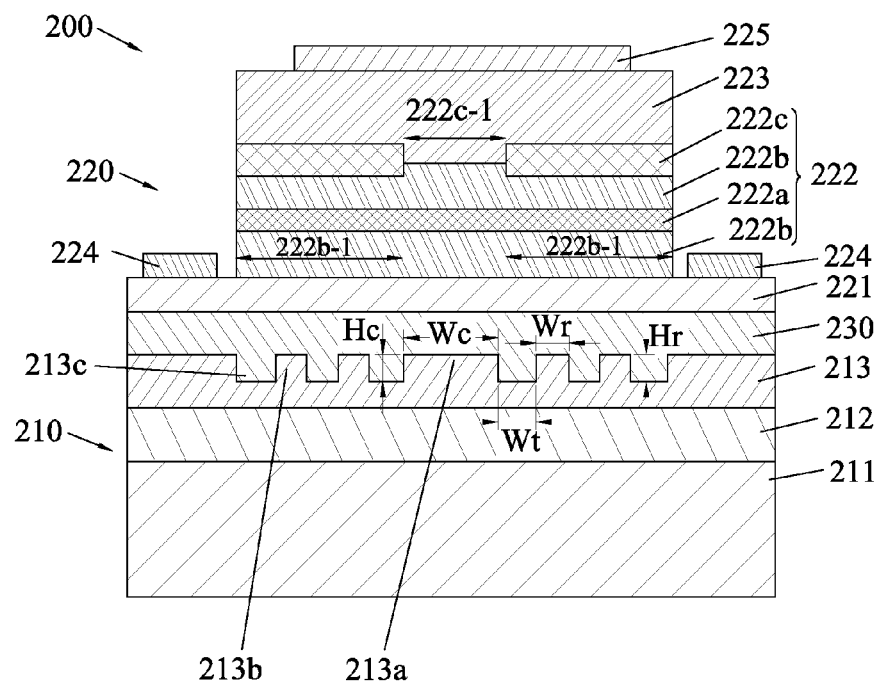
FIG. 3b is a cross section of a semiconductor laser apparatus according to a second embodiment of the present invention.

As shown in FIG. 3b, the edge-emitting semiconductor laser assembly 220 includes an n-type layer, such as n-InP layer 221, a gain region (namely active region) 222, and a p-type layer, such as p-InP layer 223 stacked in turn. A pair of n contacts 224 is electrically connected with the n-Inp layer 221, and a p contact 225 is electrically connected with the p-InP layer 223 as the cladding. The gain region 222 is active and driven to emit laser beams. Furthermore, the edge-emitting semiconductor laser 220 further includes two reflectors (not shown) to determine its laser type, such as simple Fabry-Perot (FP) Broad Area (BA) laser, Distributed Bragg Reflector (DBR) laser, Distributed Feedback (DFB) laser, or Quantum cascade laser (QCL), which will be described selectively thereinafter.

FIG. 3b also shows the gain region 222 of the edge-emitting semiconductor laser assembly 220 further includes an active layer 222a, two separate confinement heterostructure (SCH) layers 222b sandwiching the active layer 222a, and a current confinement layer 222c with an channel diameter 222c-1 in the middle. Specifically, the active layer 222a is typically constructed from one or more quantum wells (QW) or quantum dots of InGaAs, GaAs, AlGaAs, InAlGaAs, or InGaNAsP, or chemical elements selected from III-V, II-VI and IV groups of periodic table. The active layer 222a is configured to generate light having a predetermined emission wavelength, such as 1.31~1.55 um wavelengths for long range optical communications. In this embodiment, the width of the LD stack 220 was kept as 7.9 µm, for example, which includes the channel width 222c-1 kept at 3.0 µm, and a combined 4.9 µm proton implanted distance on both sides of 222b-1.

As shown, the LD stack 220 is integrated on SOI stack 210 with a formation of multiple vertical ribs 213b and multiple trenches 213c adjacent to single silicon waveguide core 213a, which will be described thereinafter. In this case, the carriers injected through p-contact 225 and n-contact 224 are re-combined to emit photons and evanescently coupled to single silicon waveguide core 213a.

Figure 4:
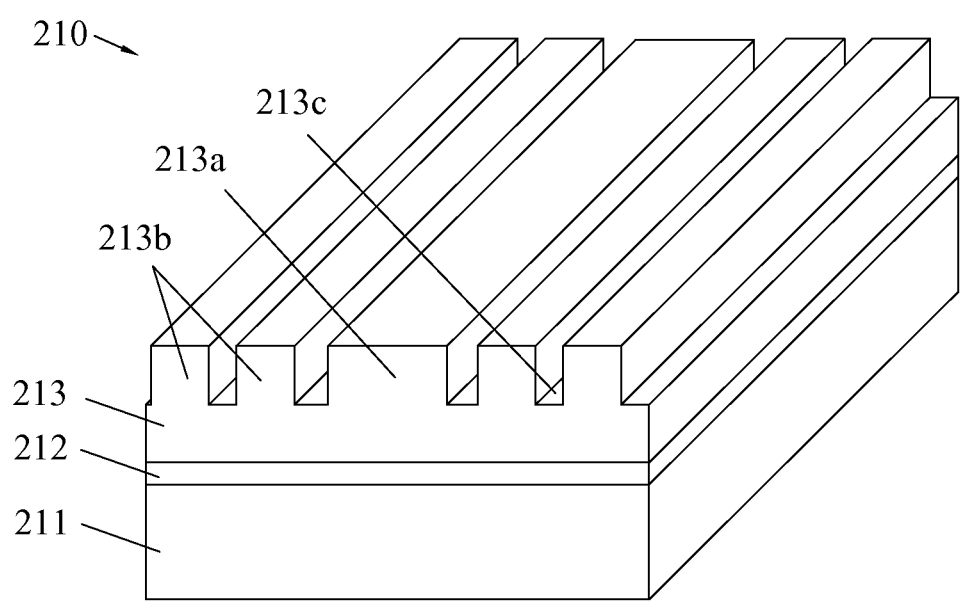
FIG. 4 is a partial perspective view of a SOI assembly shown in FIG. 3a or 3b, showing the optical waveguide of the present invention.

FIG. 4 shows a partial perspective view of a SOI assembly 210 of the semiconductor laser apparatus 200 shown in FIG. 3a or 3b, which shows the silicon waveguide core portion 213a and the adjacent multiple vertical ribs 213b. As an embodiment, the SOI assembly 210 includes a substrate 211, a buried oxide layer (BOX) 212 stacked on the substrate 211, and the optical waveguide 213 stacked on the buried oxide layer 212. Specifically, the substrate 211 is a silicon substrate, and the optical waveguide 213 is also made of silicon.

Combined with FIGS. 3b and 4, as an embodiment of the disclosure, the optical waveguide layer 213 includes a core portion 213a located in the middle of the optical waveguide 213 and which namely is called as single silicon waveguide core portion, and at least one vertical rib 213b configured at both sides of the core portion 213a respectively. In this embodiment, two vertical ribs 213b at each side are provided, but the amount thereof is not limited in the disclosure. In other words, several trenches 213c are formed, between the adjacent ribs 213b, or between the rib 213b and the core portion 213a. Commonly, the trenches 213c are formed by dry etching process, such as RIE, after etching the vertical ribs 213b and the core portion 213a with predetermined size are formed. In this disclosure, the wide central silicon waveguide core portion 213a acts as a "CORE" and the multiple vertical ribs 213b on both sides act as a "SHELL", thus the optical waveguide 213 in the disclosure is called as silicon CORE_SHELL waveguide.

In FIG. 3b, according to the invention, the core portion 213a has a width Wc and a height Hc, and the vertical rib 213b has a width Wr and a height Hr, and Wc is larger than Wr, and the pitch of the vertical rib 213b is indicated by Λ. Optionally, the width Wc is in the range of 600-3000 nm and the height Hc is in the range of 200-800 nm. The width Wr and the pitch Λ are related to duty cycle as $DC=Wr/(\Lambda)$. The sizes, in particular the width of the core portion 213a, the vertical rib 213b, and the DC of vertical ribs 213b are important for optical transmission loss performance.

Figure 1B:
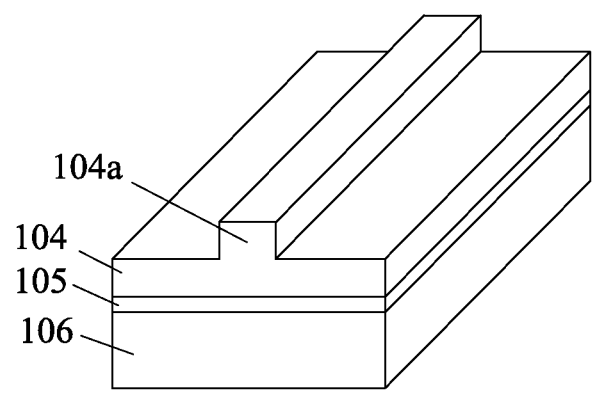
FIG. 1b is a perspective view of a conventional silicon waveguide with single silicon waveguide core/rib.
Figure 1C:
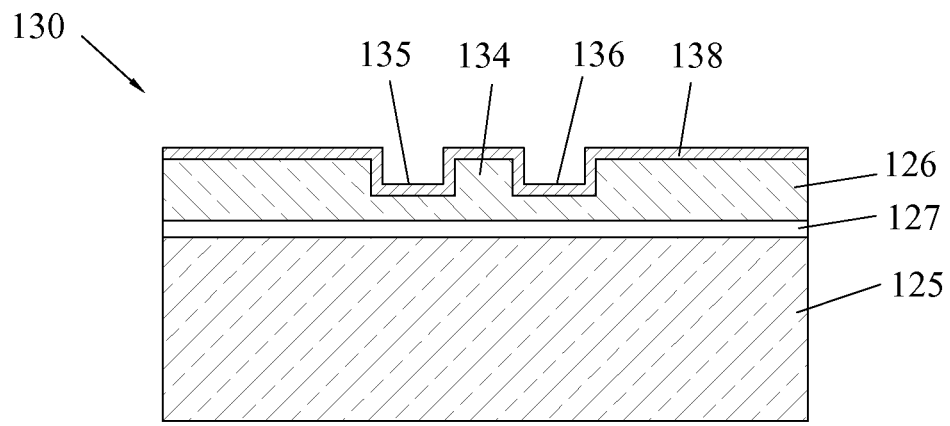
FIG. 1c shows another conventional silicon waveguide with single silicon waveguide core/rib.
Figure 5:
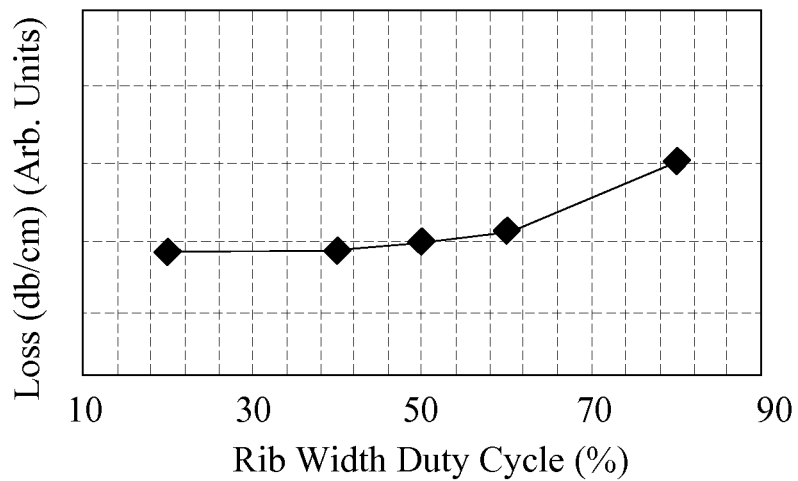
FIG. 5 shows the light propagation loss at 1.31 um emission as a function of the DC of the multiple vertical ribs adjacent to silicon waveguide core on SOI stack without a DFB grating.

In the embodiment shown in FIG. 3a or 3b, light propagation loss in the multiple vertical ribs 213b adjacent to single silicon waveguide core portion 213a will be improved, by adjusting the size of the silicon waveguide core portion 213a and the vertical ribs 213b, specially the duty cycle (DC) of the vertical ribs 213a. Theoretical modeling in FIG. 5 shows lowest transmission loss of light at DC between 20-50%. As a preferred embodiment, the height of the single silicon waveguide core portion 213a is 280 nm and the width thereof is kept at 800 nm, preferably. In this embodiment, the transmission loss of the light is much lower than the conventional single rib waveguide as shown in FIG. 1b.

Figure 1D:
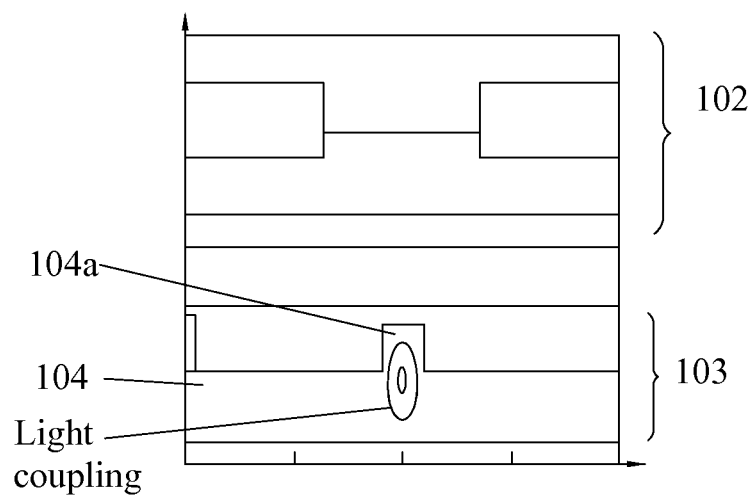
FIG. 1d shows the theoretical observation that indicates the coupling of light into the conventional single silicon waveguide core/rib.
Figure 6:
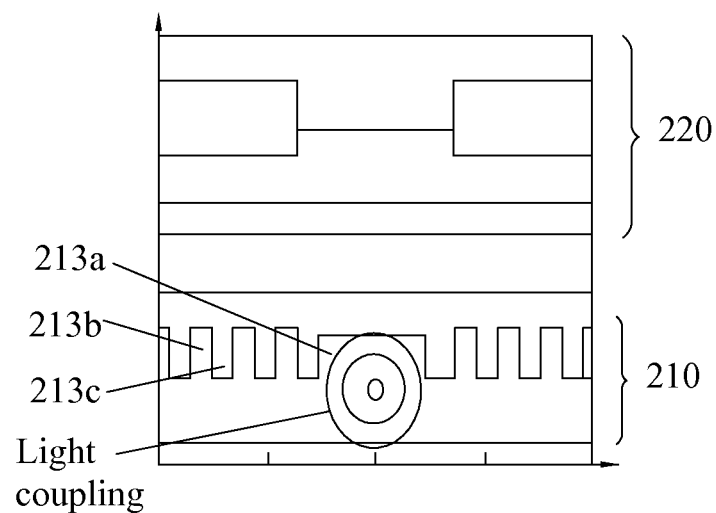
FIG. 6 shows a theoretical observation that indicates the coupling of light into the silicon waveguide core portion 213a, according to an example of the present invention.

FIG. 6 shows a theoretical observation that indicates the coupling of light into the silicon waveguide core portion 213a, according to an example of the present invention. Specifically, a DFB grating is used in this semiconductor laser apparatus 200 according to the present invention, and the vertical ribs 213b has a duty cycle of 50% (for example, the pitch=200 nm, the ribs width=100 nm, and the ribs height=800 nm), and the surface corrugation (the trenches 213c) depth=30 nm, and the cavity length=40 µm, which are designed at emission wavelength of 1.31 µm. In comparison with the light coupling of the conventional single waveguide as shown in FIG. 1d, the light transmission loss of the optical waveguide 213 of the present invention is lower than that of the conventional one, due to less optical confinement of light is presented in the LD stack 220, with the help of the multiple vertical ribs 213b. Instead, the conventional one that has higher optical confinement of light within the LD stack.

Figure 7:
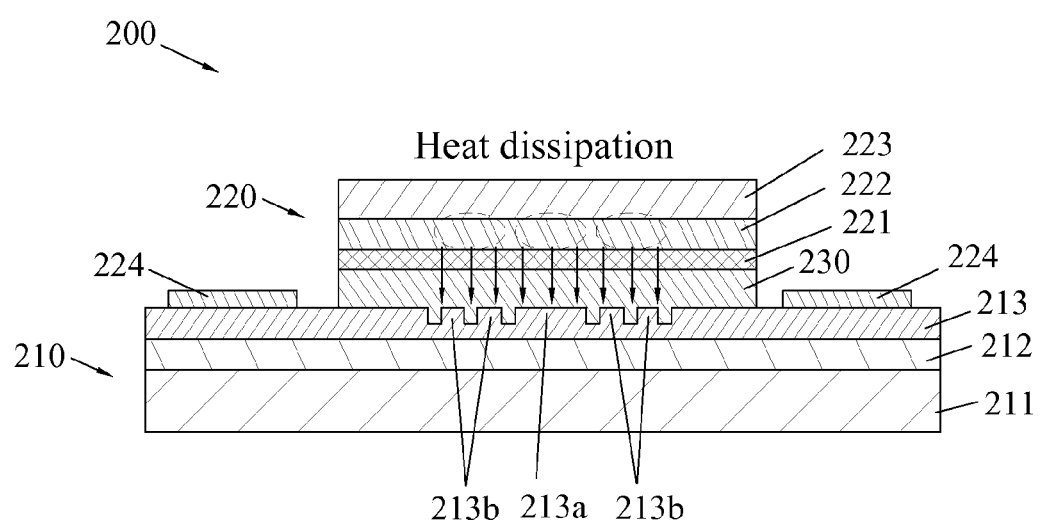
FIG. 7 shows a schematic of increased heat dissipation of the semiconductor laser apparatus according to the present invention.

Based on the configuration of the optical waveguide 213 mentioned above, when the laser light is emitted from the edge-emitting semiconductor laser assembly 210, the optical waveguide 213 guides the laser light to confine within the core portion 213a with lower transmission loss, and the evanescently coupled light confined within the optical cavity is shown in the FIG. 6. Further, as the bonding layer 230 is made of BCB, a lower thermal conductivity for example 0.3 W/m·k, while the optical waveguide 105 is made of Si which has a higher thermal conductivity for example 130 W/m·k, thus there is high probability to ineffectively dissipate heat from active layers of LD stack 220 to silicon waveguide 213 through poor thermal conductivity BCB layer, that too across central Silicon core/waveguide portion only. So, often the junction temperature of LD stack 220 can increase and degrades the device life time. Thus, the use of multiple vertical ribs 213b and wide single silicon core portion 213a are highly beneficial to reduce the junction temperature, thereby increasing the life time of the optical device. Further, the corrugation ribs 213b are also beneficial to enhance the mechanical bond strength between the bonding layer 230 and the optical waveguide 213. FIG. 7 shows a schematic of increased heat dissipation when multiple vertical ribs 213b are used, by comparison with the conventional single silicon waveguide core without ribs.

Table 1 shows thickness, refractive index and thermal conductivity parameters of semiconductor materials studied in 1.31 um laser according to the present invention. By this token, it is imperative that multiple vertical silicon ribs 213b with high thermal conductivity (130 W/m·K) are very beneficial to improve heat dissipation, configured at both sides of the single silicon waveguide core portion 213a. The values were referred from IMEC thesis.

TABLE 1

| Layer | Thickness (nm) | Refractive Index | Thermal conductivity (W/m · K) |
|---|---|---|---|
| p-InP | 1500 | 3.198 | 68 |
| SCH | 325 | 3.270 | 11.1 |
| Barrier (x9) | 81 | 3.453 | 7.2 |
| QW (x8) | 56 | 3.592 | 7.2 |
| Spacer | 240 | 3.198 | 68 |
| BCB | 40-160 | 1.537 | 0.3 |
| Silicon | 500 | 3.49 | 130 |
| BOX/SiO2 | 1000 | 1.45 | 1.24 |

Figure 8A:
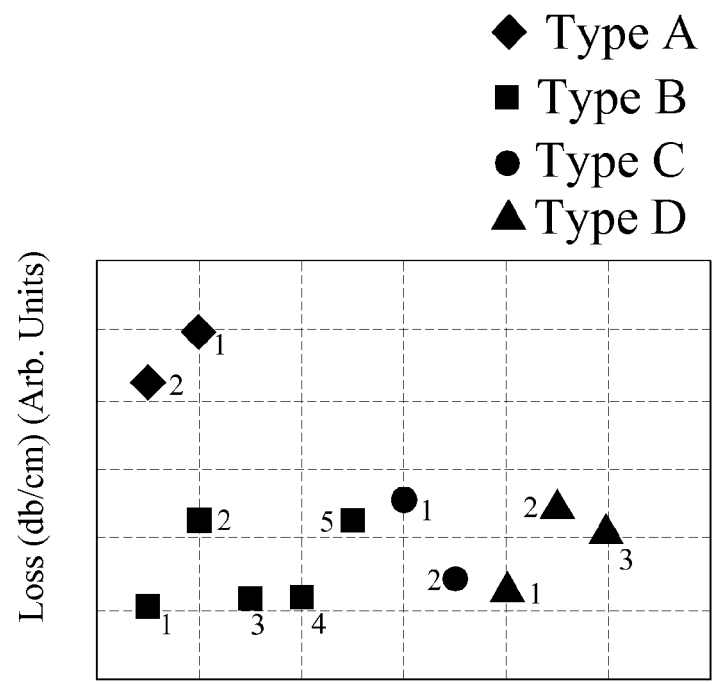
FIG. 8a shows a comparison schematic of light propagation loss at 1.31 um wavelength between the conventional single silicon core waveguide without shell (ribs beside the core portion) and various Core-shell silicon waveguides according to the present invention.

FIG. 8a shows a comparison schematic of light propagation loss at 1.31 um wavelength between the conventional single silicon core waveguide without shell (ribs beside the core portion) and various Core-shell silicon waveguide structures according to the present invention. Specifically, Type A indicates examples of the conventional single silicon core waveguide without DFB gratings, Type B indicate examples of the conventional single silicon core waveguide with DFB gratings, Types C and D indicates some examples of the Core-shell silicon waveguide according to the invention, in which their related parameters are shown in Table 2. For example, in Types C and D, the vertical ribs 213b has a duty cycle (DC) of 50% (for example, the pitch=200 nm, the ribs width=100 nm, and the ribs height=800 nm), and the surface corrugation (the trenches 213c) depth=30 nm, and the cavity length=40 µm, which are designed at emission wavelength of 1.31 µm. The BCB thickness is also varied between 40 to 160 nm, and vertical ribs in the silicon waveguide are fully etched off in some specific cases, which will be described thereinafter. As shown in FIG. 8a, the light propagation loss of Types C and D is lower and decreased in comparison to the Types A and B the conventional ones.

TABLE 2

| Type | Example | Si core width (nm) | Si vertical rib height (nm) | Air gap (nm) | DFB grating width (nm) | DC of the vertical ribs |
|---|---|---|---|---|---|---|
| Conventional A | 1 | 800 without DFB | 220 | 40 | No DFB | No vertical ribs |
|  | 2 | 800 without DFB | 220 | 40 | 800 | No vertical ribs |
| Conventional B | 1 | 2000 with DFB | 220 | 40 | 2000 | No vertical ribs |
|  | 2 | 2000 with | 220 | 40 | 2000 | No |

TABLE 2-continued

| Type | Example | Si core width (nm) | Si vertical rib height (nm) | Air gap (nm) | DFB grating width (nm) | DC of the vertical ribs |
|---|---|---|---|---|---|---|
| | | DFB | | | | vertical ribs |
| | 3 | 2000 with DFB | 220 | 160 | 800 | No vertical ribs |
| | 4 | 2000 with DFB | 220 | 160 | 2000 | No vertical ribs |
| | 5 | 2000 with DFB | 220 | 40 | 2000 | No vertical ribs |
| Invention C | 1 | 2000 with DFB | 220 | 40 | 2000 | 50% |
| | 2 | 2000 with DFB | 220 | 160 | 2000 | 50% |
| Invention D | 1 | 2000 with DFB | 500 (Rib etched fully) | 160 | 2000 | 50% |
| | 2 | 2000 with DFB | 500 (Rib etched fully) | 40 | 2000 | 50% |
| | 3 | 2000 with DFB | 500 (Rib etched into the BOX layer) | 100 | 2000 | 50% |

Figure 8B:
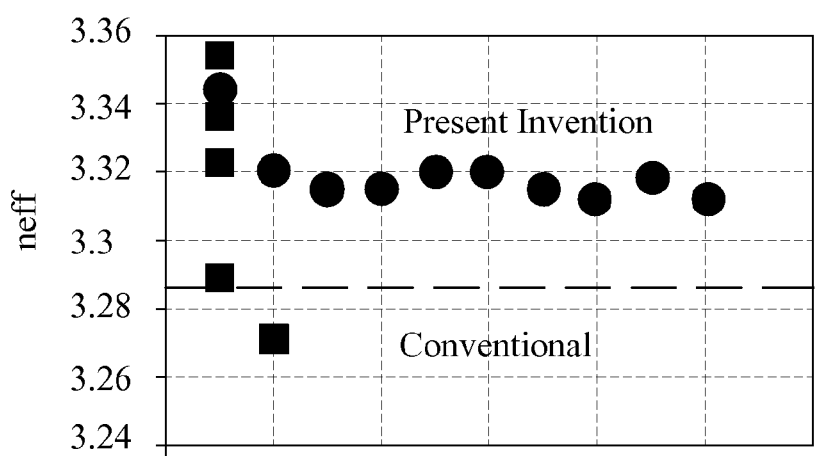
FIG. 8b shows a comparison schematic of effective refractive index between the conventional single silicon core waveguide without shell (ribs beside the core portion) and various Core-shell silicon waveguide according to the present invention.

FIG. 8b shows a comparison schematic of effective refractive index between the conventional single silicon core waveguide without shell (ribs beside the core portion) and various Core-shell silicon waveguide according to the present invention. It is disclosed that the effective refractive index of laser apparatus in all cases B, C and D is higher than the effective refractive index of laser apparatus in case A. This implies that the core-shell silicon waveguides according to the present invention offer high degree of optical confinement and are beneficial in evanescently coupling light from LD stack to SOI stack, while maintaining single mode operation at all times.

Figures 1, 9A:
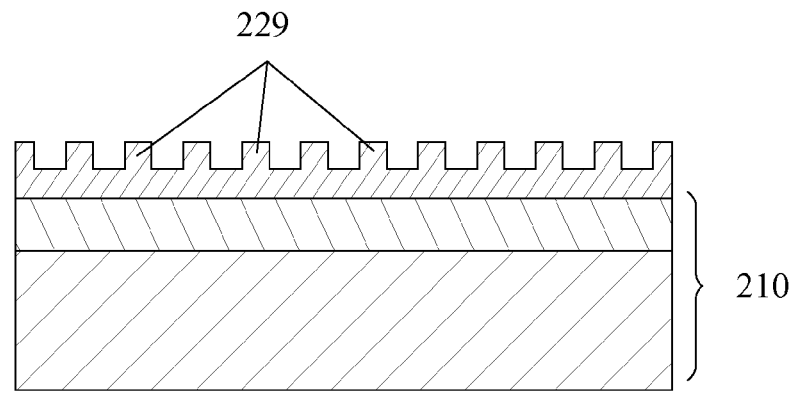
FIG. 9a-1, 9a-2, 9b-1, 9b-2, 9c-1, 9c-2 show variations of the edge-emitting semiconductor laser according to the present inventions, with different DFB grating or DBR grating configurations.
Figures 2, 9A:
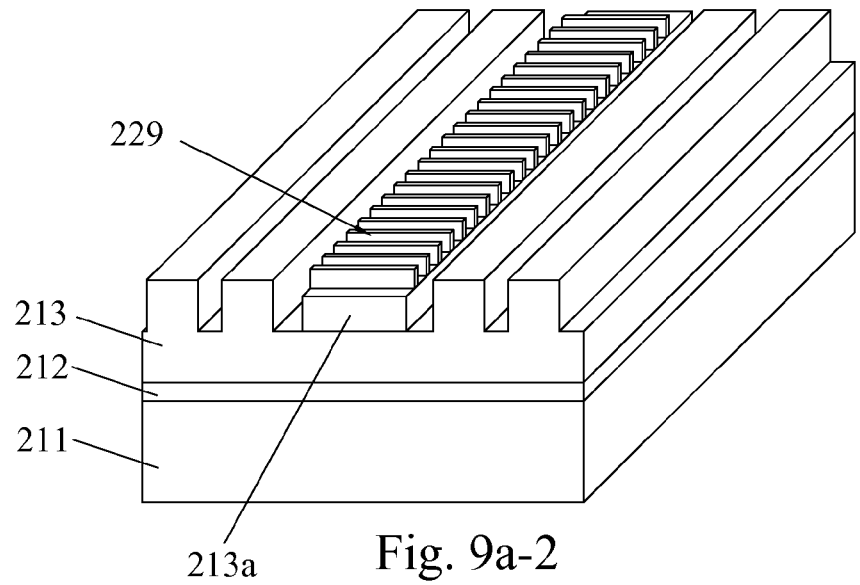

FIGS. 9a-1, 9a-2, 9b-1, 9b-2, 9c-1, and 9c-2 show variations of the edge-emitting semiconductor laser 220 according to the present inventions. As shown in FIGS. 9a-1 and 9a-2, a DFB grating 229 is formed on a top surface of the core portion 213a of the silicon waveguide 213 along the length direction thereof. The DFB grating 229 can be formed according to a standard method, which is not described here.

Figures 1, 9B:
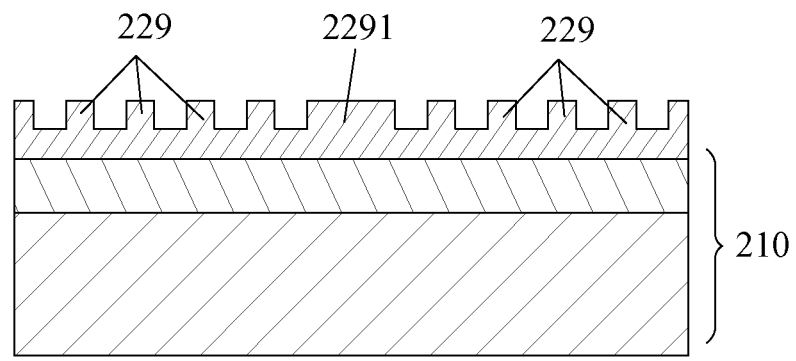
Figures 2, 9B:
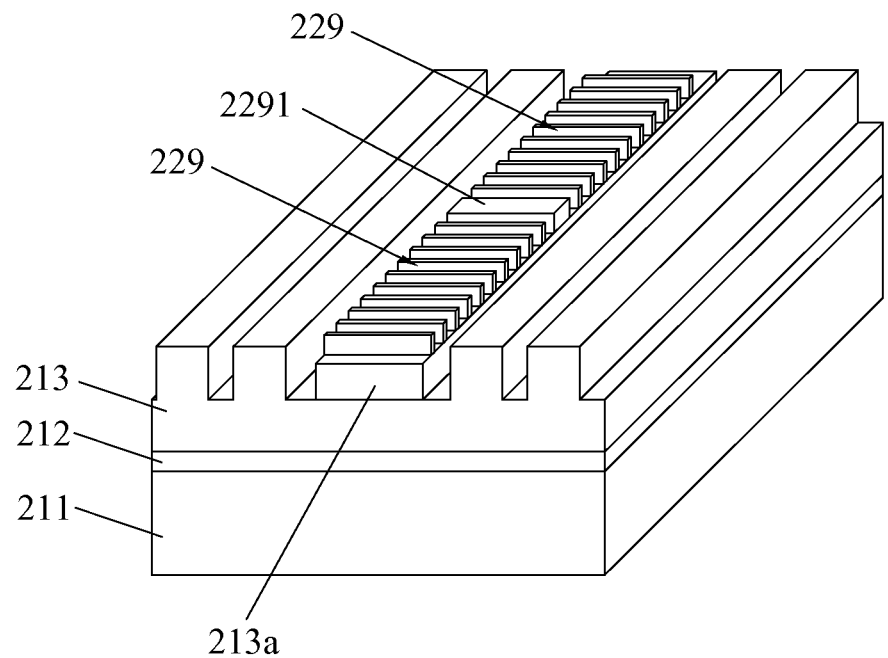

FIGS. 9b-1 and 9b-2 show a DFB grating 229 with phase shifted element 2291 etched on the core portion 213a and other DFB gratings 229 are arranged as the embodiment shown in FIGS. 9a-1 and 9a-2. This phase shifted element 2291 can select only single wavelength emission and ensures stable single mode performance of DFB laser 220. The single wavelength emission from this phase shifted DFB grating 229 offers narrower spectral line width often as low as 0.1 nm, paving a way for long distance (few 10's of KM) optical communication.

Figures 1, 9C:
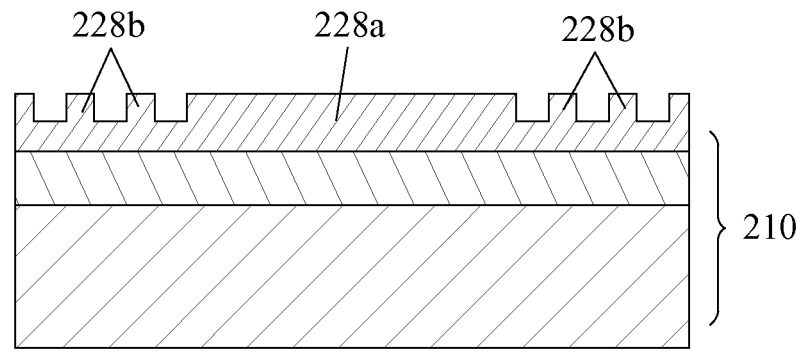
Figures 2, 9C:
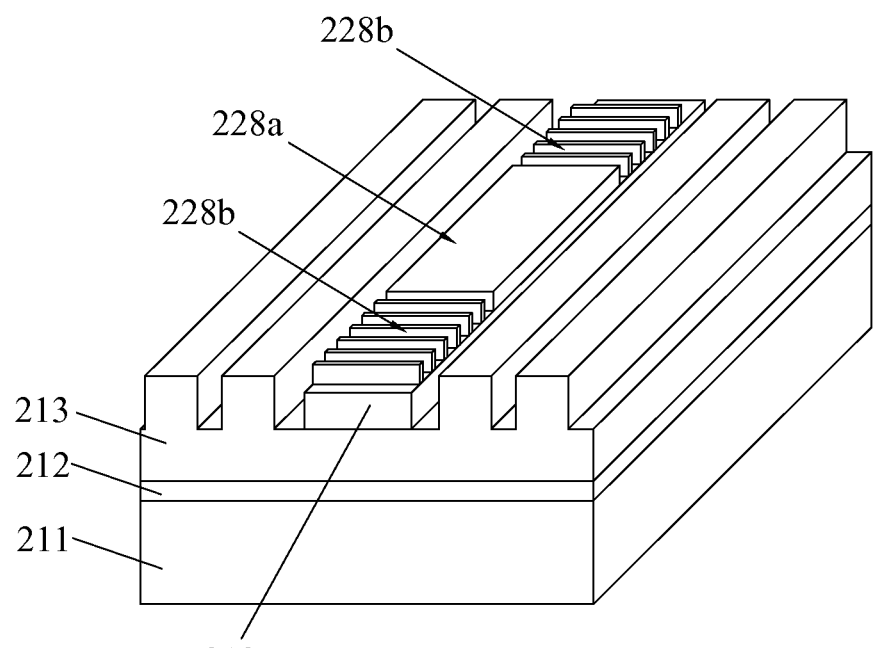

FIGS. 9c-1 and 9c-2 show a DBR grating formed on the top surface of the core portion 213a. Specifically, the surface corrugations 228b at two sides of the silicon waveguide 213 acts as reflecting mirrors, while the central un-etched surface 228a functions as a simple Fabry-perot (FP) Broad Area (BA) laser. The function of DBR grating on the top of the silicon waveguide core portion 213a is different from the DFB grating 229 and acts a larger spectral linewidth nearly (2.0 nm).

Figure 10A:
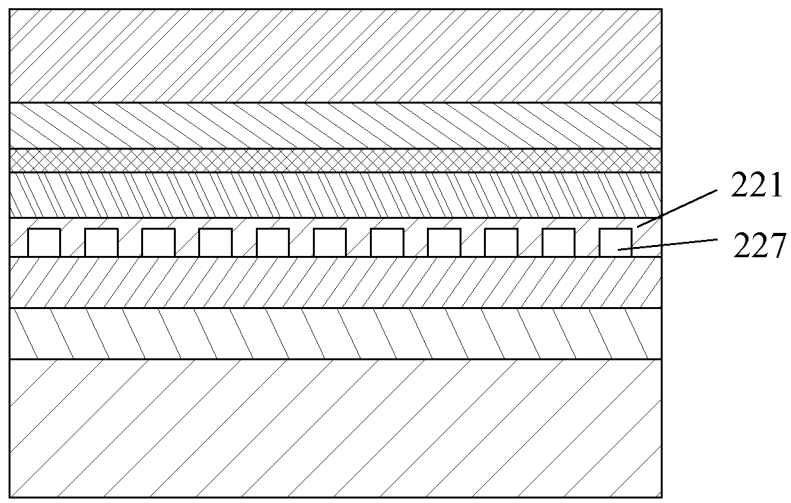
FIGS. 10a~10e show variations of the semiconductor laser apparatus according to the present invention.
Figure 10B:
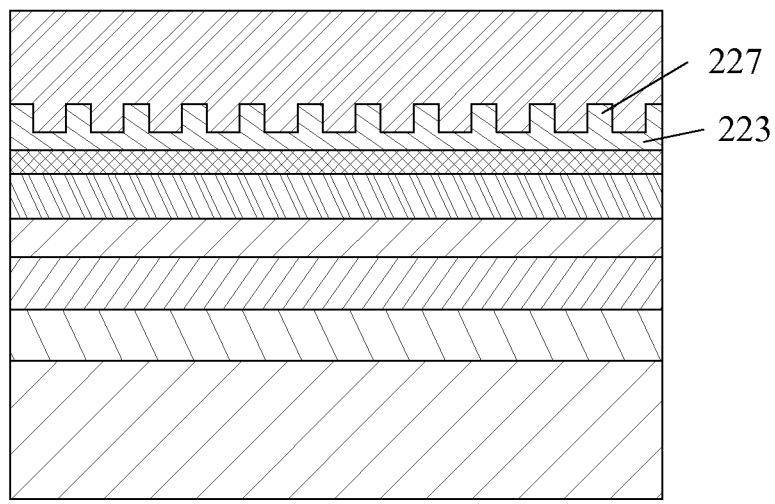

FIGS. 10a~10b show variations of the edge-emitting semiconductor laser 220 with DFB gratings according to the present invention. As shown, the edge-emitting semiconductor laser 220 is a DFB laser which further includes a row of DFB gratings 227 configured on the bottom of the n-InP layer 221 as shown in FIG. 10a, or on the top of the p-InP layer 223 as shown FIG. 10b, which are not illustrated one by one. In this embodiment, the DFB gratings 227 are arranged in the same phases.

Figure 10C:
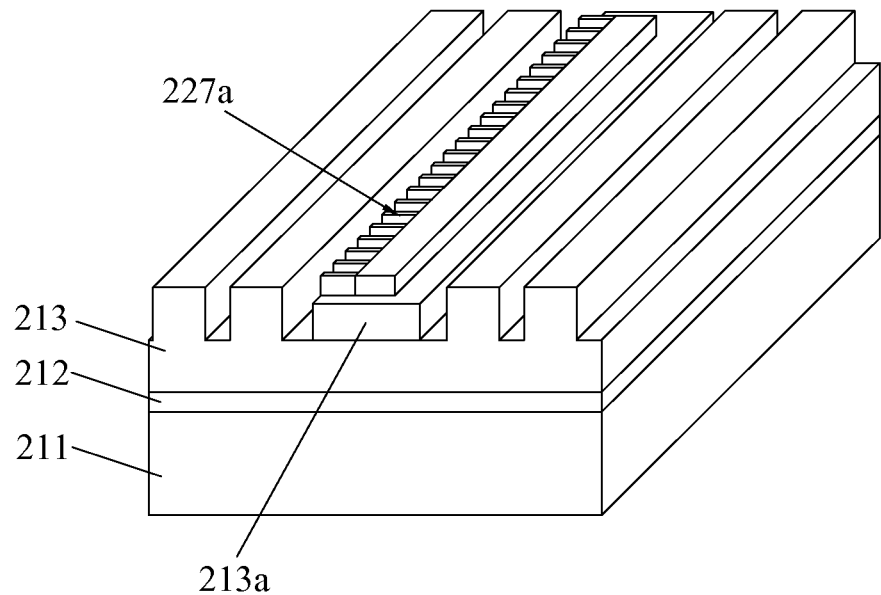
Figure 10D:
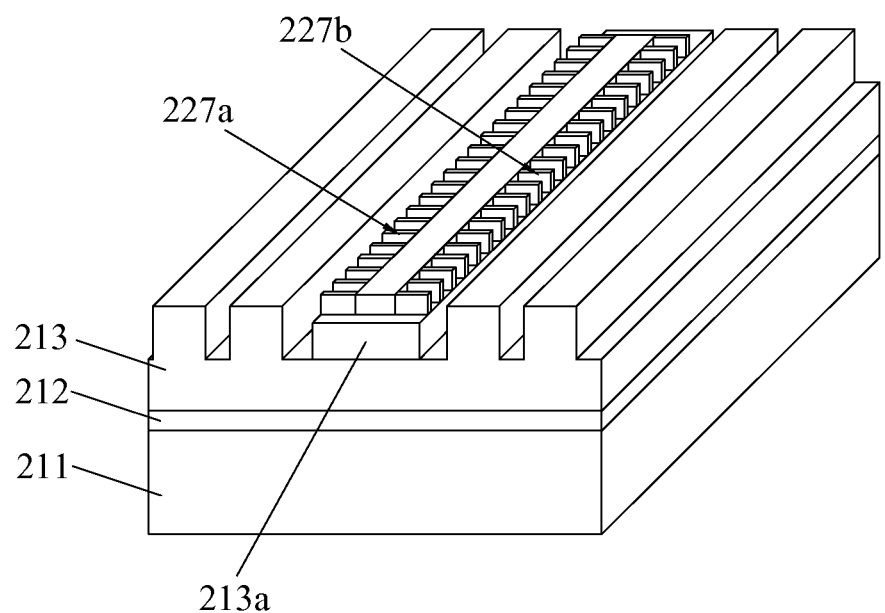

As shown in FIGS. 10c and 10d the edge-emitting semiconductor laser 220 has one or two rows of DFB grating 227a and 227b, which is a modification based on the configuration shown in FIG. 10a.

Figure 10E:
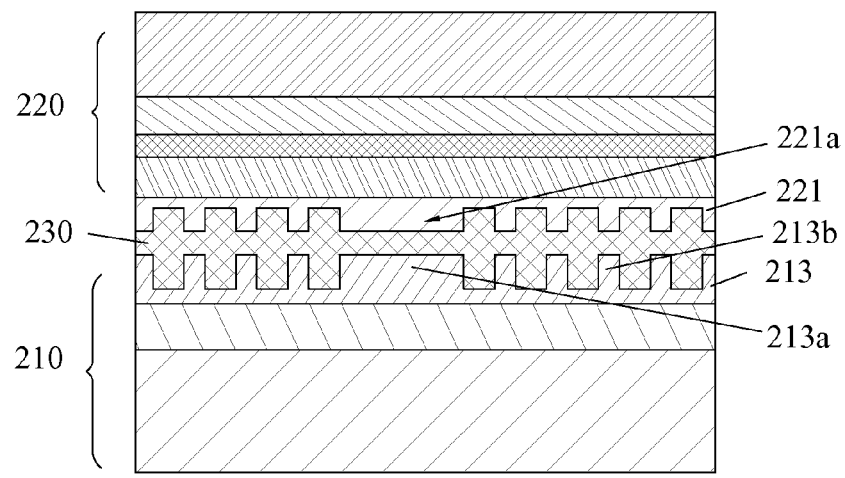

For enhancing the bond strength between the edge-emitting semiconductor laser 220 and the SOI assembly (stack) 210, FIG. 10e shows a partial cross section of the semiconductor laser apparatus according to another embodiment of the present invention. As described above, the edge-emitting semiconductor laser 220 and the SOI assembly 210 are bonded together via the BCB layer 230 therebetween. In the disclosure, the optical waveguide 213 has a corrugation structure including the core portion 213a, multiple vertical ribs 213b, and trenches 213c on the surface to be bonded with the BCB layer 230. Thus in this embodiment, the layer of the edge-emitting semiconductor laser 220 to be bonded with the BCB layer, namely the n-InP layer 221 also has a corresponding corrugation structure 221a corresponding to the optical waveguide 213. Based on this configuration, the BCB material will be filled in the corrugation structures with enlarged bonding area, thus the bond strength is enhanced.

Figure 11A:
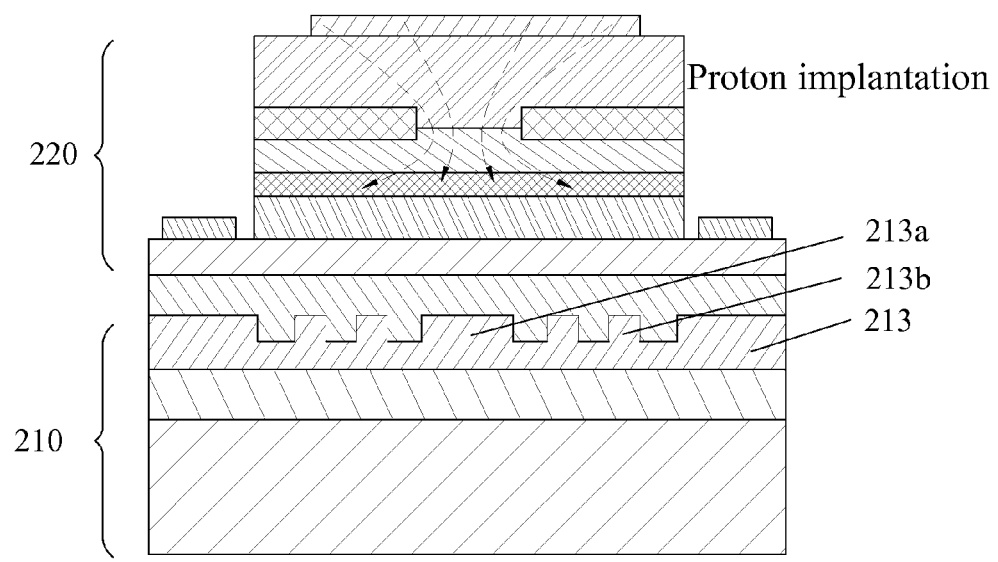
FIGS. 11a~11b show the channeling of injected carriers through proton implantation and the tunnel junction in the laser apparatus.
Figure 11B:
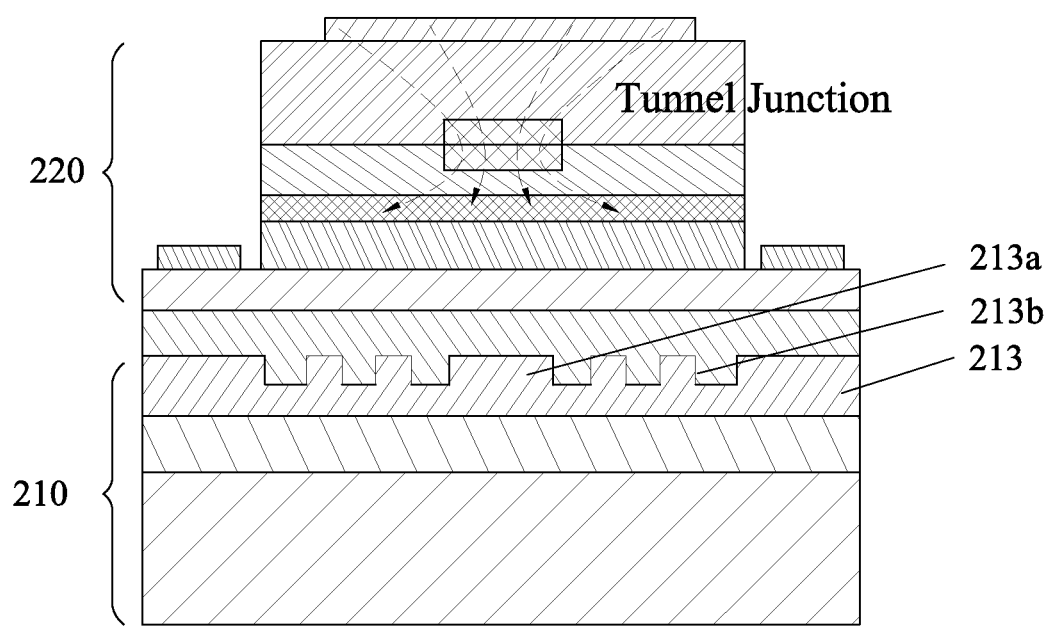

FIG. 11a shows the channeling of injected carriers through proton implantation in multiple vertical ribs 213b formed adjacent to the silicon waveguide core portion 213a for 1.3 μm DFB laser. Tunnel junction through heavily doped semiconductors can also be used to channel carriers into active region as shown in FIG. 11b.

Figure 12A:
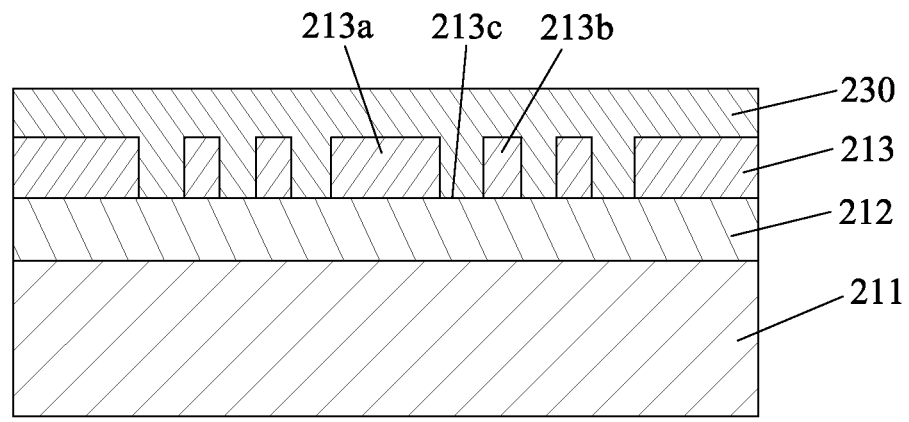
FIGS. 12a~12b show embodiments of the SOI assembly that illustrates the different configuration of the optical waveguide, showing the etching depth of the vertical ribs.
Figure 12B:
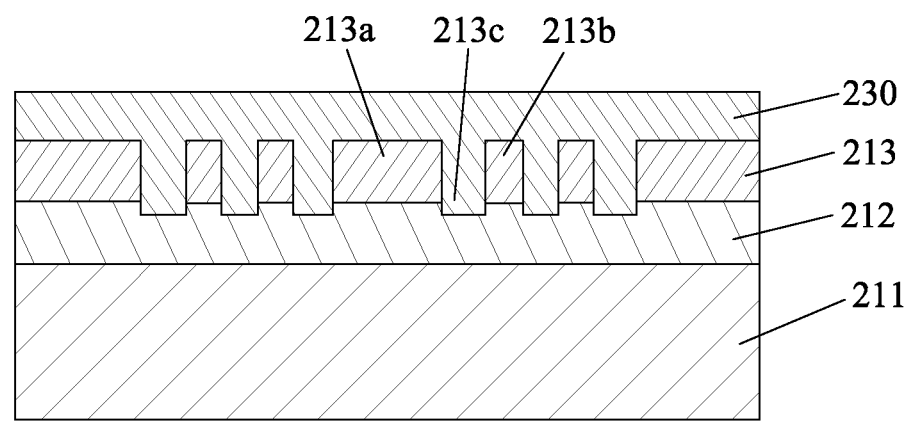

FIGS. 12a~12b show embodiments of the SOI assembly 210 that illustrates the different configuration of the optical waveguide 213. In this embodiment, the core portion 213*a* and multiple vertical ribs 213*b* are formed by etching the trenches 213*c* fully. That is, some portions to be formed as the trenches 213*c* are etched from top to bottom, to expose the top surface of the buried oxide layer 212, as shown in FIG. 12*a*. As a result, the core portion 213*a* and the vertical ribs 213*b* are separate respectively. After bond process, the bonding material BCB 230 is filled in the trenches 213*c* to further enhance the bond strength. As shown in FIG. 12*b*, the difference is that the vertical ribs 213*b* are etched into the buried oxide layer 212 with a predetermined depth.

Figure 13:
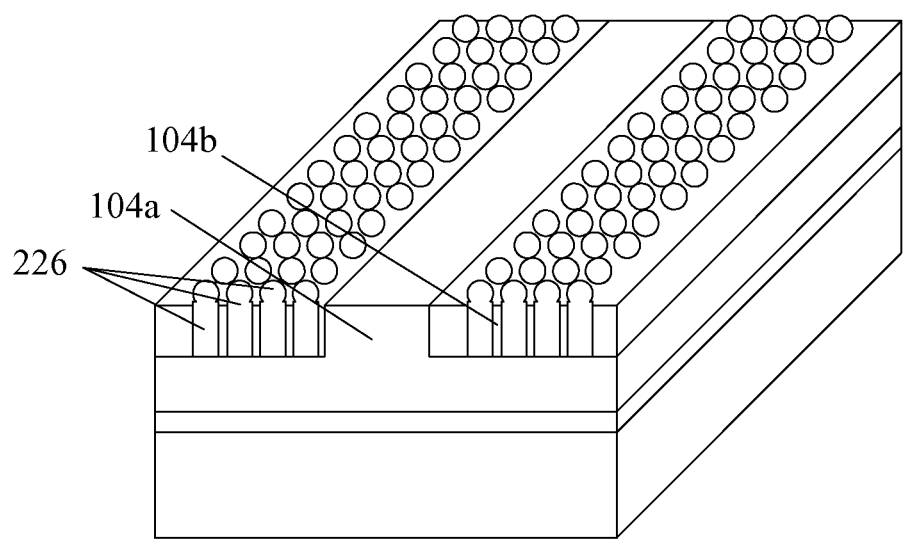
FIG. 13 shows the optical waveguide according to another embodiment of the present invention, with photonic crystal cavities in the vertical ribs.

In other embodiment, for adjusting the effective refractive index of the optical waveguide 213 to improve the light coupling and the mechanical bond strength between the LD stack 220 and the SOI stack 210, the vertical ribs 213*b* can be provided with multiple photonic crystal cavities 226 formed thereon, as shown in FIG. 13. Optionally, the photonic crystal cavities 226 can be configured in arrays, and the shapes can be square, triangular or rectangular. In this embodiment, the fill factor of the vertical ribs 213*b* beside the core portion 213*a* can be varied from 5-90%.

In the invention it should be noted that, the optical waveguide with Core-shell structure also can be configured in the Germanium-on-insulator (GeOI) stack. That is, the formation of the waveguide core portion and multiple vertical ribs can be extended to GeOI substrate, which brings the same and corresponding advantages. In addition, the optical waveguide with Core-shell structure also can be configured in the Silicon-Germanium-on-insulator (SiGeOI) stack. That is, the formation of the waveguide core portion and multiple vertical ribs can be extended to SiGeOI substrate.

Figure 14:
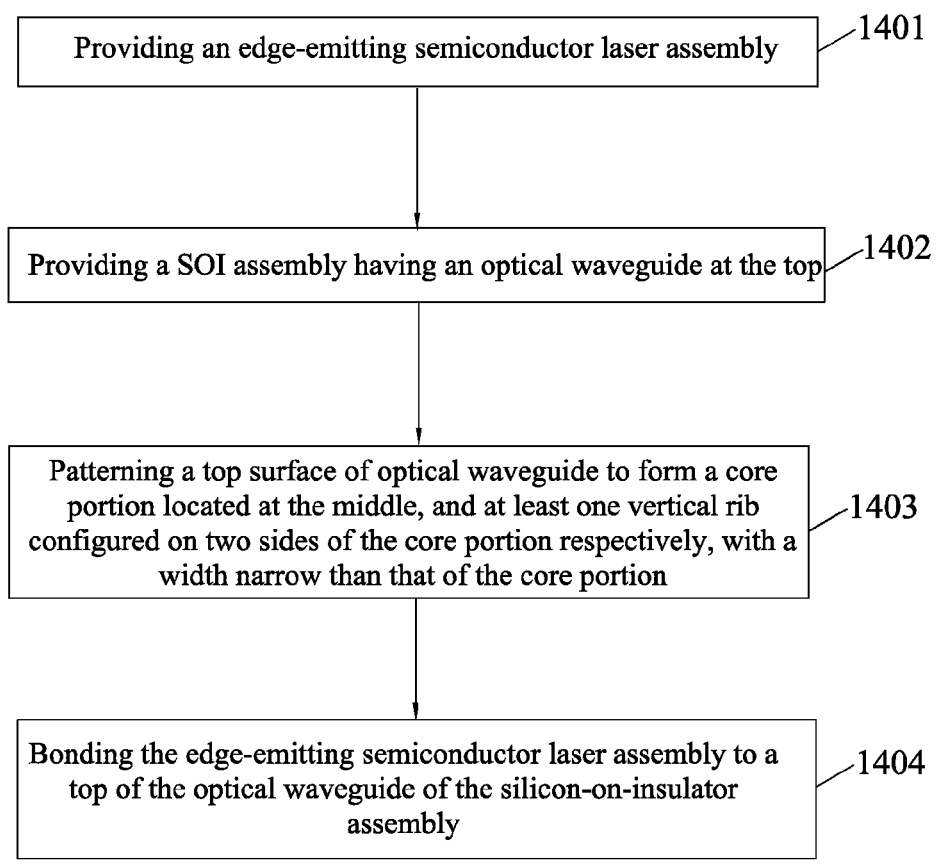
FIG. 14 is a flowchart of a method of manufacturing a semiconductor laser apparatus according to one embodiment of the present invention.

FIG. 14 shows a flowchart of a method of manufacturing a semiconductor laser apparatus according to one embodiment of the present invention. The method includes the following steps.

Step 1401, providing an edge-emitting semiconductor laser assembly 220;

Step 1402, providing a SOI assembly 210 having an optical waveguide at the top;

Step 1403, patterning a top surface of optical waveguide to form a core portion located at the middle, and at least one vertical rib 213*b* configured at two sides of the core portion 213*a* respectively, with a width narrow than that of the core portion; and Step 1404, bonding (integration) of the edge-emitting semiconductor laser assembly 220 on the top surface of the optical waveguide of the SOI assembly 210.

In the step 1401, the edge-emitting semiconductor laser assembly (LD stack) 220 can be a simple FP BA laser, DBR laser, DFB laser, or QCL, such as the embodiment described in FIG. 3*a*, or FIG. 3*b*. In the step 1402, the SOI assembly 210 can be that one described in the embodiment of FIG. 4*b*, but not limited. Preferably, the optical waveguide is made of silicon.

In the step 1403, the patterning process can be an etching process. Specifically, any suitable etching process may be used to form the trenches 213*c* and concurrently the core portion 213*a* and the ribs 213*b*. However, the preferred etching process is reactive ion etch (RIE). In this embodiment, the width We of the core portion is in the range of 600-3000 nm, the height Hc of the core portion is in the range of 200-800 nm and the duty cycle of the multiple vertical ribs 213*b* is in the range of 5-80%. In the disclosure, the amount of the vertical ribs can be selected according to the actual demand; preferably, the vertical ribs at left and right sides of the core portion are symmetrically formed.

In the step 1404, the edge-emitting semiconductor laser assembly 220 is bonded to the top surface of the optical waveguide of the SOI assembly 210 by a bonding layer 230, such a BCB material.

When the laser light is emitted from the edge-emitting semiconductor laser assembly 220, the optical waveguide 213 guides the laser light to confine within the core portion 213*a* with lower transmission loss. Further, the light is confined in single mode due to the significant effective refractive index difference between LD stack 220 and SOI stack 210. Additionally, the multiple ribs 213*b* of the waveguide are beneficial to reduce the junction temperature due to its high thermal conductivity, thereby increasing the life time of the optical device, and meanwhile, the corrugation ribs 213*b* are also beneficial to enhance the mechanical bond strength between the bonding layer 230 and the optical waveguide 213.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the invention.

What is claimed is:

1. A semiconductor laser apparatus, comprising:
a silicon-on-insulator assembly; and
an edge-emitting semiconductor laser assembly integrated on the silicon-on-insulator assembly;
the silicon-on-insulator assembly comprising an optical waveguide at the top which is bonded to the edge-emitting semiconductor laser assembly and configured to couple a laser light emitted from the edge-emitting semiconductor laser assembly, wherein the optical waveguide comprises:
a core portion located in the middle of the optical waveguide; and
at least one vertical rib configured on two sides of the core portion respectively, with a width narrower than that of the core portion,
wherein the edge-emitting semiconductor laser assembly comprises a simple Fabry-Perot (FP) Broad Area (BA) laser, a Distributed Bragg Reflector (DBR) laser, a Distributed Feedback (DFB) laser, or a Quantum cascade laser (QCL), and the edge-emitting semiconductor laser assembly comprises the DFB laser which comprises at least one row of DFB gratings disposed on a top surface of the core portion along the length direction thereof.

2. The semiconductor laser apparatus according to claim 1, wherein the silicon-on-insulator assembly comprises a substrate, a buried oxide layer stacked on the substrate, and the optical waveguide stacked on the buried oxide layer.

3. The semiconductor laser apparatus according to claim 1, wherein the optical waveguide is made of silicon.

4. The semiconductor laser apparatus according to claim 1, wherein the vertical rib is formed by etching the portions at two sides of the core portion.

5. The semiconductor laser apparatus according to claim 4, wherein said etching has a depth that reaches to a bottom of the optical waveguide to expose a top surface of a buried oxide layer of the silicon-on-insulator assembly.

6. The semiconductor laser apparatus according to claim 4, wherein said etching has a depth that reaches into a buried oxide layer of the silicon-on-insulator assembly.

7. The semiconductor laser apparatus according to claim 1, wherein the edge-emitting semiconductor laser assembly has an injected carrier channeling window made of proton implantation or tunnel junction.

8. The semiconductor laser apparatus according to claim 1, wherein the DFB gratings are made on a bottom clad semiconductor layer or a top clad semiconductor layer.

9. The semiconductor laser apparatus according to claim 1, wherein the DFB gratings comprise a phase shifted DFB grating in the middle of the gratings.

10. The semiconductor laser apparatus according to claim 9, wherein the DFB gratings comprise a phase shifted DFB grating made on a bottom clad semiconductor layer or a top clad semiconductor layer.

11. The semiconductor laser apparatus according to claim 9, wherein the DFB gratings comprise phase shifted DFB gratings which are formed on the core portion and a bottom clad semiconductor layer.

12. The semiconductor laser apparatus according to claim 1, wherein the edge-emitting semiconductor laser assembly comprises an active region which comprises single or multiple quantum wells or quantum dots emitting at 1.31 µm and 1.55 µm wavelengths, and is made of chemical elements selected from III-V, II-VI and IV groups of periodic table.

13. The semiconductor laser apparatus according to claim 1, wherein multiple photonic crystal cavities are formed on the vertical ribs to adjust the effective index of the optical waveguide.

14. The semiconductor laser apparatus according to claim 1, wherein the width of the core portion is in the range of 600-3000nm, a height of the core portion is in the range of 200-800 nm.

15. The semiconductor laser apparatus according to claim 1,
wherein the width of the vertical ribs (Wr) and a pitch between the vertical ribs (Λ) related by duty cycle (DC) as DC=Wr/Λ, and the DC is in the range of 5-90%, and a height of the vertical ribs is in the range of 200-800nm same as a height of the core portion.

16. A method of manufacturing a semiconductor laser apparatus, comprising steps of:
providing an edge-emitting semiconductor laser assembly;
providing a silicon-on-insulator assembly having an optical waveguide at the top;
patterning a top surface of optical waveguide to form a core portion located in the middle, and at least one vertical rib configured on two sides of the core portion respectively, with a width narrower than that of the core portion;
forming multiple photonic crystal cavities on the vertical ribs to adjust the effective index of the optical waveguide; and
bonding the edge-emitting semiconductor laser assembly to a top of the optical waveguide of the silicon-on-insulator assembly.

17. The method according to claim 16, wherein said patterning the top surface of the optical waveguide comprises etching the top surface of the optical waveguide to form the core portion and the vertical ribs in the predetermined size.

18. The method according to claim 16, wherein the width of the core portion is in the range of 600-3000nm, a height of the core portion is in the range of 200-800 nm.

19. The method according to claim 16, wherein the width of the vertical ribs (Wr) and a pitch between the vertical ribs (Λ) related by duty cycle (DC) as DC=Wr/Λ, and the DC is kept in the range of 5-90%, and a height of the vertical ribs is in the range of 200-800nm same as a height of the core portion.

20. The method according to claim 16, wherein the optical waveguide is made of silicon.

21. A semiconductor laser apparatus, comprising:
a silicon-on-insulator assembly; and
an edge-emitting semiconductor laser assembly integrated on the silicon-on-insulator assembly,
the silicon-on-insulator assembly comprising an optical waveguide at the top which is bonded to the edge-emitting semiconductor laser assembly and configured to couple a laser light emitted from the edge-emitting semiconductor laser assembly, wherein the optical waveguide comprises:
a core portion located in the middle of the optical waveguide; and
at least one vertical rib configured on two sides of the core portion respectively, with a width narrower than that of the core portion,
wherein the edge-emitting semiconductor laser assembly comprises an active region which comprises single or multiple quantum wells or quantum dots emitting at 1.31 µm and 1.55 µm wavelengths, and is made of chemical elements selected from III-V, II-VI and IV groups of periodic table.

22. A semiconductor laser apparatus, comprising:
a silicon-on-insulator assembly; and
an edge-emitting semiconductor laser assembly integrated on the silicon-on-insulator assembly,
the silicon-on-insulator assembly comprising an optical waveguide at the top which is bonded to the edge-emitting semiconductor laser assembly and configured to couple a laser light emitted from the edge-emitting semiconductor laser assembly, wherein the optical waveguide comprises:
a core portion located in the middle of the optical waveguide; and
at least one vertical rib configured on two sides of the core portion respectively, with a width narrower than that of the core portion,
wherein multiple photonic crystal cavities are formed on the vertical ribs to adjust the effective index of the optical waveguide.

* * * * *